(12) United States Patent  
Watakabe

(10) Patent No.: US 11,587,761 B2  
(45) Date of Patent: Feb. 21, 2023

(54) CHARGED PARTICLE BEAM APPARATUS AND SETTING ASSISTING METHOD

(71) Applicant: JEOL Ltd., Tokyo (JP)

(72) Inventor: Kazutaka Watakabe, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/380,142

(22) Filed: Jul. 20, 2021

(65) Prior Publication Data

US 2022/0028649 A1 Jan. 27, 2022

(30) Foreign Application Priority Data

Jul. 21, 2020 (JP) .............................. JP2020-124585

(51) Int. Cl.
*H01J 37/26* (2006.01)
*H01J 37/22* (2006.01)

(52) U.S. Cl.
CPC ............ *H01J 37/226* (2013.01); *H01J 37/26* (2013.01)

(58) Field of Classification Search
CPC .. H01J 37/00; H01J 37/02; H01J 37/26; H01J 37/226; H01J 37/256; H01J 37/265; H01J 37/28; H01J 2237/2485
USPC ......................................... 250/306, 307, 311
See application file for complete search history.

(56) References Cited

U.S. PATENT DOCUMENTS

| 4,894,541 | A | 1/1990 | Ono |
| 2006/0060774 | A1* | 3/2006 | Oosaki ................. G01N 23/225 250/307 |
| 2017/0213695 | A1 | 7/2017 | Bizen et al. |
| 2020/0321189 | A1* | 10/2020 | Yokosuka ............... H01J 37/28 |

FOREIGN PATENT DOCUMENTS

| JP | S60100038 A | 6/1985 |
| JP | S6435838 A | 2/1989 |
| JP | H0231146 A | 2/1990 |
| JP | H03165437 A | 7/1991 |
| JP | H11185689 A | 7/1999 |
| JP | 200239976 A | 2/2002 |
| JP | 200262270 A | 2/2002 |
| JP | 2003197143 A | 7/2003 |
| JP | 2003240738 A | 8/2003 |
| JP | 2004163135 A | 6/2004 |
| JP | 2006275756 A | 10/2006 |
| JP | 2011186044 A | 9/2011 |

(Continued)

OTHER PUBLICATIONS

Extended European Search Report issued in EP21186466.5 dated Jan. 5, 2022.

(Continued)

*Primary Examiner* — Jason L McCormack

(74) *Attorney, Agent, or Firm* — The Webb Law Firm

(57) ABSTRACT

A GUI (graphical user interface) image includes an input portion and a reference image. The reference image includes a plan diagram and numerical value information. The plan diagram includes a figure indicating an electron penetration range, a figure indicating a characteristic X-ray generation range, and a figure indicating a back-scattered electron generation range. The numerical value information includes numerical values indicating sizes of these ranges.

7 Claims, 11 Drawing Sheets

(56) References Cited

FOREIGN PATENT DOCUMENTS

WO          2016016927 A1      2/2016

OTHER PUBLICATIONS

Jercinovic et al., In-situ trace element analysis of monazite and other fine-grained accessory minerals by EPMA, Chemical Geology, 2008, vol. 254, pp. 197-215.
Zhao and Darwin, Quantitative Backscattered Electron Analysis Techniques for Cement-Based Materials, a Report on Research Sponsored by the Air Force Office of Scientific Research, 1990, pp. 1-57.
Office Action issued in JP2020124585 dated Jun. 14, 2022.

* cited by examiner

FIG. 3

| ELEMENT | ATOMIC NUMBER (Z) | MASS (A) | DENSITY ($\rho$) | MINIMUM EXCITATION ENERGY (Ec) | ... |
|---|---|---|---|---|---|
| **** | **** | **** | **** | **** | ... |
| **** | **** | **** | **** | **** | ... |
| **** | **** | **** | **** | **** | ... |
| . . . | . . . | . . . | . . . | . . . | . . . |

CHARGED PARTICLE BEAM APPARATUS AND SETTING ASSISTING METHOD

CROSS REFERENCE TO RELATED APPLICATION

This application claims priority to Japanese Patent Application No. 2020-124585 filed Jul. 21, 2020, the disclosure of which is hereby incorporated by reference in its entirety.

BACKGROUND OF THE INVENTION

Field of the Invention

The present disclosure relates to a charged particle beam apparatus and a method of assisting setting, and in particular to a technique to assist setting of an illumination condition.

Description of Related Art

As charged particle beam apparatuses, there are known a scanning electron microscope, an electron beam microanalyzer, an ion beam illumination apparatus, and the like. In the following, a scanning electron microscope will be described as a representative apparatus of these charged particle beam apparatuses.

A scanning electron microscope is an apparatus in which an electron beam which is a charged particle beam is illuminated onto a specimen, and secondary electrons, back-scattered electrons, characteristic X-rays, or the like emitted from the specimen are detected. An image representing a surface or a surface layer of the specimen is formed based on a sequence of detection signals acquired by two-dimensional scanning of the electron beam. With an analysis of the characteristic X-rays emitted from the specimen, a qualitative analysis and a quantitative analysis of the specimen are executed.

In a measurement of the specimen by the scanning electron microscope, an electron penetration range (an electron beam penetration range, an electron scattering range) in the specimen changes depending on an element forming the specimen, and the electron penetration range in the specimen also changes depending on an accelerating voltage of the electron beam. Similarly, a range in the specimen in which the back-scattered electrons are generated, and a range in the specimen in which the characteristic X-rays are generated change depending on the element forming the specimen and the accelerating voltage of the electron beam.

In the scanning electron microscope, an illumination condition such as the accelerating voltage is set by designation of a numerical value by a user. In the related art, during setting of the illumination condition, there is no display of a schematic diagram or the like for assisting a setting operation. There is also known a simulation apparatus which estimates an electron scattering range or a signal generation range in the specimen. However, such an apparatus is not a measurement apparatus, and functions as a single entity, and there has been no cooperation between such an apparatus and the charged particle beam apparatus.

JP 2004-163135 A and JP 2006-275756 A disclose calculation of an X-ray generation region in the specimen, and determination of the accelerating voltage based on the X-ray generation region. JP 2002-62270 A discloses display of a characteristic X-ray generation region in an overlapping manner over an element distribution map. However, these publications do not disclose provision of an image for assisting setting during the setting of the illumination condition by a user. In the present disclosure, the concept of the setting of the illumination condition includes processes to check and change the illumination condition.

An advantage of the present disclosure lies in assisting setting of an illumination condition by a user in a charged particle beam apparatus. Alternatively, an advantage of the present disclosure lies in enabling, in a charged particle beam apparatus, setting of the illumination condition while imagining a range of a physical phenomenon which occurs in a specimen.

SUMMARY OF THE INVENTION

According to one aspect of the present disclosure, there is provided a charged particle beam apparatus comprising: a calculator that calculates a size of a range of a physical phenomenon which occurs in a specimen when a charged particle beam is illuminated onto the specimen, based on specimen information and an illumination condition; a generator that generates a reference image having a plan diagram indicating the range of the physical phenomenon and numerical value information indicating the size of the range of the physical phenomenon; and a display that displays the reference image when an actual illumination condition of the charged particle beam is set.

According to another aspect of the present disclosure, there is provided a method of assisting setting, the method comprising: calculating a size of a range of a physical phenomenon which occurs in a specimen when a charged particle beam is illuminated onto the specimen; generating a reference image having a plan diagram indicating the range of the physical phenomenon and numerical value information indicating the size of the range of the physical phenomenon; and displaying the reference image.

BRIEF DESCRIPTION OF THE DRAWINGS

Embodiment(s) of the present disclosure will be described based on the following figures, wherein:

FIG. 3 is a diagram showing an example of an element table;

DESCRIPTION OF THE INVENTION

Figure 1:
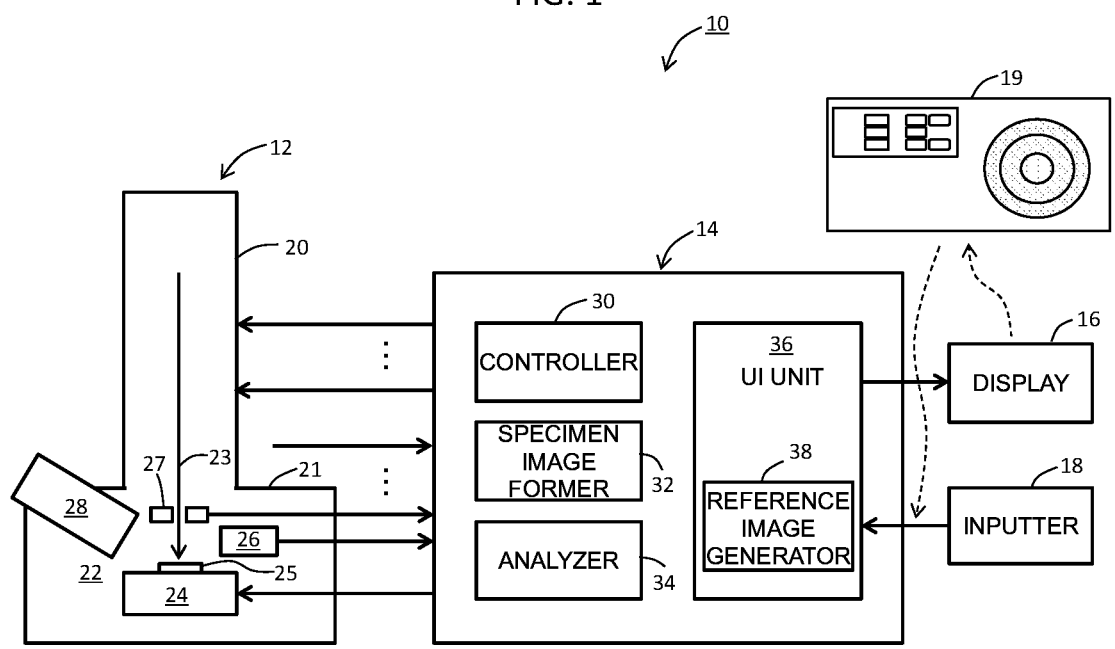
FIG. 1 is a conceptual diagram showing a scanning electron microscope according to an embodiment of the present disclosure.

An embodiment of the present disclosure will now be described with reference to the drawings.

(1) Overview of Embodiment

A charged particle beam apparatus according to an embodiment of the present disclosure comprises a calculator, a generator, and a display. The calculator calculates a size of a range of a physical phenomenon which occurs in a specimen when a charged particle beam is illuminated onto the specimen, based on specimen information and an illumination condition. The generator generates a reference image. The reference image has a plan diagram indicating the range of the physical phenomenon, and numerical value information indicating the size of the range of the physical phenomenon. The reference image is displayed on the display when an actual illumination condition of the charged particle beam is set.

According to the above-described structure, by referring to the plan diagram and the numerical value information included in the reference image, it becomes possible to set the actual illumination condition while imagining a range of the physical phenomenon which occurs in the specimen. Even when the reference image is only a rough estimate, with the provision of the reference image, the user can be assisted. In particular, users with poor knowledge of the charged particle beam or the charged particle beam apparatus can be assisted.

According to an embodiment of the present disclosure, a graphical user interface image including the reference image is provided to the user, and processes to check and change the illumination condition are executed through this image. The specimen information is information for specifying a composition of the specimen, and is more specifically element information. The illumination condition for the generation of the reference image is an illumination condition of the charged particle beam. As specific examples of the illumination condition, there may be exemplified an acceleration voltage and a specimen inclination angle. During the generation of the reference image, at least the accelerating voltage is taken into consideration. In an embodiment of the present disclosure, the charged particle beam is an electron beam. In this case, examples of the physical phenomenon include an electron penetration range (electron scattering range), a characteristic X-ray generation range, a backscattered electron generation range, or the like. The plan diagram is a display object, and is typically formed from one or a plurality of display elements (for example, figures). The numerical value information is typically formed from one or a plurality of numerical values. A size of each range may be represented by a variable display element such as a graph, along with or in place of the numerical value.

In an embodiment of the present disclosure, the calculator calculates a size of a penetration range of the charged particle beam and a size of a generation range of a signal caused by illumination of the charged particle beam, as the size of the range of the physical phenomenon. According to this structure, the illumination condition can be more appropriately set by referring to and/or comparing the penetration range and the generation range.

In an embodiment of the present disclosure, the plan diagram includes a first figure indicating the penetration range of the charged particle beam, and a second figure indicating the generation range of the signal. The numerical value information includes a first numerical value indicating a size of the penetration range of the charged particle beam, and a second numerical value indicating a size of the generation range of the signal. In an embodiment of the present disclosure, the first figure and the second figure are displayed as multiple circles.

In an embodiment of the present disclosure, the plan diagram corresponds to a plane parallel to a surface of the specimen. The generator relatively shifts a center point of each of the figures according to an inclination angle of the specimen with respect to the charged particle beam. In an embodiment of the present disclosure, the specimen has a flat form. In an embodiment of the present disclosure, the plan diagram is parallel to the surface of the specimen, regardless of the inclination angle of the specimen. When the inclination angle of the specimen is 0°, the surface of the specimen is orthogonal to a center axis (illumination axis) of the charged particle beam, and the plan diagram is also orthogonal to the illumination axis. When the ranges of a plurality of physical phenomena are respectively represented by spherical models, center points of the ranges of the plurality of physical phenomena are aligned on the illumination axis, and the center points coincide with each other on the plan diagram. On the other hand, when the specimen is inclined, the illumination axis is incident in a slanted manner with respect to the specimen, and the plurality of center points on the illumination axis are dispersed on the plan diagram on a line corresponding to the illumination axis. Thus, in the above-described structure, the center point of each figure is relatively shifted according to the inclination angle of the specimen.

In an embodiment of the present disclosure, the plan diagram corresponds to a plane orthogonal to the charged particle beam. Regardless of the inclination angle of the specimen with respect to the charged particle beam, a center point of the first figure and a center point of the second figure coincide with each other. When the plan diagram is a plane orthogonal to a center axis (illumination axis) of the charged particle beam, even when the specimen is inclined, the center points of the ranges of the plurality of physical phenomena are maintained to be positioned at an origin on the plan diagram. Thus, in the above-described structure, the center points of the figures coincide with each other.

In an embodiment of the present disclosure, the reference image having the plan diagram is a first reference image. The generator further generates a second reference image having a cross sectional diagram indicating the range of the physical phenomenon. The first reference image and the second reference image are displayed on the display. According to this structure, it becomes possible to imagine a three-dimensional form of the range of the physical phenomenon through observation of the plan diagram and the cross sectional diagram. On the cross sectional diagram, the range of each physical phenomenon may be represented by a figure of a liquid drop shape. Alternatively, the range of each physical phenomenon may be represented by a circle, an ellipse, a vase shape, or the like.

A charged particle beam apparatus according to an embodiment of the present disclosure further comprises a specimen image former and a display processor. The specimen image former forms a specimen image based on a sequence of detection signals acquired by scanning the charged particle beam with respect to the specimen. The display processor displays a plan diagram which is scaled on or near the specimen image. According to this structure, during the observation of the specimen image, the size of the range of the physical phenomenon can be recognized.

A method of assisting setting according to an embodiment of the present disclosure comprises a first step, a second step, and a third step. In the first step, there is calculated a size of a range of a physical phenomenon which occurs in a specimen when a charged particle beam is illuminated onto the specimen. In the second step, a reference image is generated which has a plan diagram indicating the range of the physical phenomenon and numerical value information indicating the size of the range of the physical phenomenon. In the third step, the reference image is displayed.

The setting assisting method described above may be realized by a function of software. In this case, a program for executing the setting assisting method is installed via a network or a transportable recording medium into a charged particle beam apparatus, an information processor, or the like.

(2) Details of Embodiment

FIG. 1 shows a charged particle beam apparatus according to an embodiment of the present disclosure. The charged particle beam apparatus is specifically a scanning electron microscope 10. In the illustrated example configuration, the scanning electron microscope 10 may primarily be separated into a measurement unit 12 and an information processor 14. The information processor 14 is formed from, for example, a personal computer (PC). A display 16 and an inputter 18 are connected to the information processor 14.

As will be described later, specimen information and an illumination condition are input through an image 19 displayed on the display 16. In addition, a plurality of physical phenomena which occur in a specimen when an electron beam is illuminated onto the specimen are schematically displayed on the display 16.

The measurement unit 12 comprises a lens barrel 20 and a body 21. An inside of the body 21 is a specimen chamber 22. In the lens barrel 20, an electron beam source, a focusing lens, a deflection scanning lens, an objective lens, or the like is provided. An electron beam 23 is generated by these constituting elements. In the specimen chamber 22, a specimen stage 24 is provided, and a specimen 25 is held by the specimen stage 24. Specifically, a specimen holder holding the specimen 25 is attached to the specimen stage 24. The specimen stage 24 has an XYZ mechanism which moves the specimen 25 in up-and-down and left-and-right directions, a rotational mechanism which rotates the specimen 25, and a tilt mechanism which inclines the specimen 25. A specimen inclination angle is also called a tilt angle.

The specimen 25 has a flat form. For example, the specimen 25 has a flat plate form or a circular disc form. Alternatively, the specimen 25 may have another form. At a tilt angle of 0°, a surface of the specimen 25 is orthogonal to a center axis (illumination axis) of the electron beam. When the specimen 25 has a complex form, a virtual plane orthogonal to the illumination axis at the tilt angle of 0° may be assumed to be the surface of the specimen 25.

In the illustrated example structure, a secondary electron detector 26, a back-scattered electron detector 27, and a characteristic X-ray spectrometer 28 are provided at a periphery of the specimen 25. These constituting elements are schematically represented. When the electron beam 23 is illuminated onto the specimen 25, secondary electrons and back-scattered electrons are emitted from the specimen 25, and a characteristic X-ray is emitted from the specimen 25. With the secondary electron detector 26, the secondary electrons emitted from the specimen 25 are detected. With the back-scattered electron detector 27, the back-scattered electrons emitted from the specimen 25 are detected. With the characteristic X-ray spectrometer 28, the characteristic X-ray emitted from the specimen 25 is detected.

The characteristic X-ray spectrometer 28 is, for example, an energy-dispersive characteristic X-ray spectrometer. In place of or in addition to the energy-dispersive characteristic X-ray spectrometer, a wavelength-dispersive characteristic X-ray spectrometer may be provided. Alternatively, a detector other than those described above may be provided. Normally, the electron beam 23 is two-dimensionally scanned with respect to the specimen 25. A plurality of detection signals which are output from the secondary electron detector 26, the back-scattered electron detector 27, and the characteristic X-ray spectrometer 28 are sent to the information processor 14.

The information processor 14 includes a processor which executes an information process, a memory which stores data and a program, or the like. In FIG. 1, a plurality of representative functions realized by the information processor 14 are represented by a plurality of blocks. Specifically, the information processor 14 functions as a controller 30, a specimen image former 32, an analyzer 34, an UI (user interface) unit 36, or the like.

The controller 30 controls operations of various devices in the measurement unit 12. With the controller 30, a plurality of operation parameters for realizing an illumination condition designated by the user are determined. The illumination condition includes an accelerating voltage of the electron beam 23, a tilt angle of the specimen, or the like. The accelerating voltage of the electron beam 23 may also be called a landing voltage of the electron beam 23, from the viewpoint of the specimen 25.

The specimen image former 32 forms a two-dimensional image representing a surface or a surface layer of the specimen 25 based on a sequence of detection signals (for example, a sequence of secondary electron detection signals or a sequence of back-scattered electron detection signals) acquired by the two-dimensional scanning of the electron beam 23. The analyzer 34 executes a qualitative analysis and a quantitative analysis of the specimen 25 based on the detection signal which is output from the characteristic X-ray spectrometer 28. Specifically, the analyzer 34 has a function to analyze the plurality of elements which form the specimen and a concentration of each element.

The UI unit 36 generates a graphical user interface (GUI) image provided to the user, and receives information which is input by the user through the GUI image. The UI unit 36 has a reference image generator 38.

The reference image generator 38 is a module which generates a reference image. As will be described later in detail, the reference image includes a plan diagram indicating ranges of a plurality of physical phenomena which occur in the specimen, and numerical value information indicating sizes of the ranges of the plurality of physical phenomena which occur in the specimen. More specifically, the plan diagram includes a plurality of figures indicating the ranges of the plurality of physical phenomena, and the numerical value information includes a plurality of numerical values indicating sizes of the ranges of the plurality of physical phenomena.

In the present embodiment, sizes of the plurality of figures (more specifically, a diameter) are constant regardless of the sizes of the ranges of the plurality of physical phenomena. The sizes of the ranges of the plurality of physical phenomena are notified to the user by the plurality of numerical values forming the numerical value information. Alternatively, the sizes of the plurality of figures may be varied depending on the sizes of the ranges of the plurality of physical phenomena.

The reference image forms an important portion of the GUI image. As the physical phenomenon, there may be exemplified electron penetration (electron scattering) and signal generation. As the signal generation, there may be exemplified generation of back-scattered electrons and generation of characteristic X-rays. The plan diagram corresponds to a plane parallel to the surface of the specimen 25. At the tilt angle of 0°, the plan diagram is orthogonal to the illumination axis, and, at a tilt angle of α°, the plan diagram is inclined by α° with respect to the illumination axis.

The reference image or the GUI image including the reference image is a support image for assisting setting of the illumination condition by the user. The user can check or change the illumination condition such as the accelerating voltage through the GUI image while imagining or recognizing, through observation of the GUI image, ranges of the plurality of the physical phenomena. As described, the UI unit 36 functions as a calculating means, a generation means, and a reception means. Further, the UI unit 36 of the present embodiment functions as a display processor means which displays a plan diagram which is scaled in an overlapping manner over the specimen image, or which displays the scaled plan diagram near the specimen image. In this case, similar to the specimen image, the plan diagram displayed along with the specimen image is orthogonal to the illumination axis regardless of the tilt angle.

In the example structure illustrated in FIG. 1, the information processor 14 has the UI unit 36, but alternatively, the UI unit 36 may be included in another information processor. For example, a first information processor including the controller 30, and a second information processor including the UI unit 36 may be provided, and these information processors may cooperate with each other.

The display 16 is formed from a liquid crystal display, an organic EL display device, or the like. The inputter 18 is formed from a keyboard, a pointing device, or the like. Alternatively, a display with a touch panel may be provided as the display 16 and the inputter 18.

Figure 2:
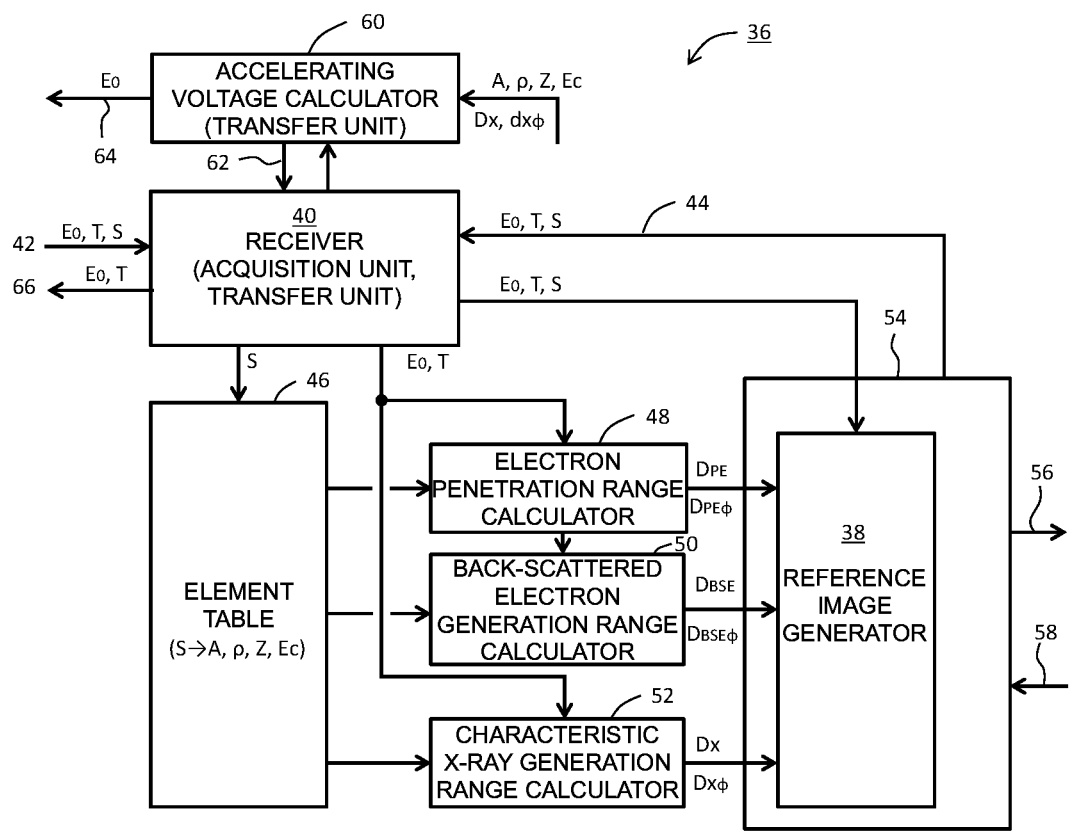
FIG. 2 is a diagram showing an example configuration of an UI (user interface) unit.

FIG. 2 shows an example configuration of the UI unit 36. A plurality of blocks shown in FIG. 2 indicate functions realized by software, except for an element table 46. A receiver 40 is a module which receives an accelerating voltage $E_0$, a tilt angle T, and specimen information S. The specimen information S is information for specifying one or a plurality of elements forming the specimen. When the specimen is formed from a plurality of elements, the specimen information S may include information for specifying a concentration (a weight ratio of each element in the specimen) of each individual element. Alternatively, the specimen information S may be formed from element information of each element.

In a specific example described below, in order to simplify the explanation, the specimen 25 is assumed to be formed from a single element. When the specimen 25 is formed from a plurality of elements, the specimen 25 may be assumed to be formed from a representative element, or an average mass, an average density, and an average atomic number may be calculated for the specimen 25 based on the concentrations of the plurality of elements forming the specimen 25, and may be utilized as the element information of the specimen 25.

As shown by reference numeral 42, the receiver 40 functions as an acquisition unit which acquires from the controller the accelerating voltage $E_0$, and the tilt angle T which are set in the controller, in response to an operation of the user. In addition, the receiver 40 functions as an acquisition unit which acquires from the analyzer the specimen information S. As shown by reference numerals 58 and 44, the receiver 40 has a function to receive the accelerating voltage $E_0$, the tilt angle T, and the specimen information S which are input by the user through the GUI image.

The receiver 40 also functions as a transfer unit (application unit) which transfers, as an actual illumination condition, the received illumination condition to the controller, to apply the illumination condition to the controller, in response to an operation of the user (refer to reference numeral 66). The illumination conditions which are transferred are the accelerating voltage $E_0$ and the tilt angle T.

The specimen information S, more specifically, information for specifying the element forming the specimen 25, is supplied from the receiver 40 to the element table 46. The element table 46 forms an element database. Element information of the element forming the specimen 25 is output from the element table 46. The element information includes a mass A, an atomic number Z, a density p, and a minimum excitation energy Ec. The minimum excitation energy Ec corresponds to a minimum energy for generating the characteristic X-ray.

An electron penetration range calculator 48 calculates an electron penetration depth $D_{PE}$ based on the accelerating voltage $E_0$, as a size of the electron penetration range (electron scattering range) in the depth direction. The electron penetration depth $D_{PE}$ is a maximum value of the electron penetration range in the depth direction. The electron penetration range calculator 48 also calculates, for the electron penetration range, a width of the electron penetration range $D_{E\varphi}$ as a size in a direction orthogonal to the depth direction (specimen surface direction). In the present embodiment, in generation of the plan diagram, the electron penetration range is represented by a spherical model. A width $D_{PE\varphi}$ of the electron penetration range is equal to the electron penetration depth $D_{PE}$. The electron penetration depth $D_{PE}$ and the width of the electron penetration range $D_{PE\varphi}$ both correspond to a diameter. Calculation formulae for determining the electron penetration depth $D_{PE}$ and the width of the electron penetration range $D_{PE\varphi}$ will be described later.

In the present embodiment, the back-scattered electron generation range calculator 50 calculates a back-scattered electron generation depth $D_{BSE}$ as a size of the back-scattered electron generation range in the depth direction. More specifically, as will be described later, the back-scattered electron generation depth $D_{BSE}$ is calculated based on the electron penetration depth $D_{PE}$. In addition, the back-scattered electron generation range calculator 50 calculates a width of the back-scattered electron generation range $D_{BSE\varphi}$ as a size of the back-scattered electron generation range in the specimen surface direction. In the present embodiment, in generation of the plan diagram, the back-scattered electron generation range is represented as a spherical model. The width of the back-scattered electron generation range $D_{BSE\varphi}$ is equal to the back-scattered electron generation depth $D_{BSE}$. The back-scattered electron generation depth $D_{BSE}$ and the width of the back-scattered electron generation range $D_{BSE\varphi}$ both correspond to the diameter. If necessary, reference may be made to the element information which is output from the element table 46 in the calculation of these. Calculation formulae for determining the back-scattered electron generation depth $D_{BSE}$ and the width of the back-scattered electron generation range $D_{BSE}$ will be described later.

In the present embodiment, the characteristic X-ray generation range calculator 52 calculates a characteristic X-ray generation depth $D_X$ as a size of the characteristic X-ray generation range in the depth direction. In addition, the characteristic X-ray generation range calculator 52 calculates a width of the characteristic X-ray generation range $D_{X\varphi}$ as a size of the characteristic X-ray generation range in the specimen surface direction. In the present embodiment, in the generation of the plan diagram, the characteristic X-ray generation range is represented by a spherical model. The width of the characteristic X-ray generation range $D_{X\varphi}$ is equal to the characteristic X-ray generation depth $D_X$. The characteristic X-ray generation depth $D_X$ and the width of the characteristic X-ray generation range $D_{X\varphi}$ both correspond to the diameter. When the characteristic X-ray generation depth $D_X$ and the width of the characteristic X-ray generation range $D_{X\varphi}$ are calculated, reference is made to the minimum excitation energy Ec which is output from the element table 46. Calculation formulae for determining the characteristic X-ray generation depth $D_X$ and the width of the characteristic X-ray generation range $D_{X\varphi}$ will be described later.

When a plurality of characteristic X-rays may be generated from one element, the generation depth $D_X$ or the like may be calculated for a representative characteristic X-ray among the plurality of characteristic X-rays, or a plurality of generation depths $D_X$ or the like may be calculated for all of the plurality of the characteristic X-rays. Alternatively, a table may be prepared for automatically determining the representative characteristic X-ray for which the calculation is to be performed, according to the accelerating voltage. Alternatively, when the electron penetration depth $D_{PE}$, the back-scattered electron generation depth $D_{BSE}$, and the characteristic X-ray generation depth $D_X$ are calculated, the tilt angle may be taken into consideration.

An image generator 54 is a module which generates the GUI image, and includes the reference image generator 38. To the reference image generator 38, there are supplied the width of the electron penetration range $D_{PE\varphi}$ (or the electron penetration depth $D_{PE}$), the width of the back-scattered electron generation range $D_{BSE\varphi}$ (or the back-scattered electron generation depth $D_{BSE}$), the width of the characteristic X-ray generation range $D_{X\varphi}$ (or the characteristic X-ray generation depth $D_X$), the accelerating voltage $E_0$, the tilt angle T, and the specimen information S. A plurality of numerical values forming the numerical value information in the reference image are formed from the width of the electron penetration range $D_{PE\varphi}$, the width of the back-scattered electron scattering range $D_{BSE\varphi}$, and the width of the characteristic X-ray generation range $D_{X\varphi}$. Alternatively, the plurality of numerical values forming the numerical value information may be formed from the electron penetration depth $D_{PE}$, the back-scattered electron generation depth $D_{BSE}$, and the characteristic X-ray generation depth $D_X$. Reference numeral 56 shows a signal which is output to the display. Reference numeral 58 shows a signal from the inputter.

An accelerating voltage calculator 60 is a module which back-calculates the accelerating voltage $E_0$ from the characteristic X-ray generation depth $D_X$ (or the width of the characteristic X-ray generation range $D_{X\varphi}$) as necessary. For this back calculation, reference is made to the specimen information S, and other information. The back-calculated accelerating voltage $E_0$ is sent to the receiver 40 (refer to reference numeral 62). In this manner, the values are re-calculated. The back-calculated accelerating voltage $E_0$ is sent to the controller as necessary (refer to reference numeral 64). With this process, the accelerating voltage $E_0$ is applied to the controller; that is, the accelerating voltage $E_0$ is activated.

In the example configuration of FIG. 2, a configuration may be employed in which, in addition to the input of the illumination condition such as the accelerating voltage on the GUI image, the controller may be asked to input the illumination condition. This is a safety measure for the user to more cautiously perform the setting of the illumination condition. In this case also, the GUI image is still an image for assisting the setting of the illumination condition. However, as such a re-input is complicated, in the present embodiment, an application button for activating the input illumination condition is prepared. This function will be described later.

Similar to the related art, processes to newly set the illumination condition, to check the illumination condition, and to change the illumination condition can be executed through the setting image (which does not have the reference image) for setting the illumination condition. Such a setting image is generated by the controller shown in FIG. 1. For example, users having abundant knowledge and experience for the electron beam or the scanning electron microscope may set the illumination condition on the setting image, without going through the display of the GUI image.

FIG. 3 shows an example structure of the element table. The element table 46 is constructed on a nonvolatile memory. The element table 46 has a plurality of records 70 corresponding to a plurality of elements. Each record 70 includes element information for an element 72, and the element information is formed from a plurality of pieces of physical information. The plurality of pieces of physical information include an atomic number 74, a mass 76, a density 78, a minimum excitation energy 80, or the like. As described above, a plurality of minimum excitation energies 80 may be registered corresponding to a plurality of characteristic X-rays for each individual element.

Calculation methods will now be described for the electron penetration depth $D_{PE}$, the width of the electron penetration range $D_{PE\varphi}$, the back-scattered electron generation depth $D_{BSE}$, the width of the back-scattered electron scattering range $D_{BSE\varphi}$, the characteristic X-ray generation depth $D_X$, and the width of the characteristic X-ray generation range $D_{X\varphi}$. In the following, for the purpose of simplifying explanation, the specimen is assumed to be formed from a single element.

The electron penetration depth $D_{PE}$ is calculated through the following Formula (1) which is known in the art.

[Formula 1]

$$D_{PE} = 0.033 \frac{AE_0^{1.7}}{\rho \cdot Z} \tag{1}$$

In Formula (1) described above, A represents a mass of an element (atom), $E_0$ represents the accelerating voltage, $\rho$ represents a density of the element, and Z represents an atomic number. The mass A, the density $\rho$, and the atomic number Z are specified in the element table. The width of the electron penetration range $D_{PE\varphi}$ is assumed to be equal to the electron penetration depth $D_{PE}$, as shown by the following Formula (2).

[Formula 2]

$$D_{PE\varphi} = D_{PE} \tag{2}$$

The back-scattered electron generation depth $D_{BSE}$ is calculated by the following Formula (3). Specifically, the back-scattered electron generation depth $D_{BSE}$ is calculated immediately from the electron penetration depth $D_{PE}$, and as a half of the electron penetration depth $D_{PE}$.

[Formula 3]

$$D_{BSE} = 1/2 D_{PE} \tag{3}$$

The width of the back-scattered electron generation range $D_{BSE\varphi}$ is assumed to be equal to the back-scattered electron generation depth $D_{BSE}$, as shown by the following Formula (4).

[Formula 4]

$$D_{BSE\varphi}=D_{BSE} \quad (4)$$

The characteristic X-ray generation depth $D_X$ is calculated by the following Formula (5), which is known. Ec represents the minimum excitation energy for a particular electron orbital.

[Formula 5]

$$D_X = 0.033 \frac{A(E_0^{1.7} - E_C^{1.7})}{\rho \cdot Z} \quad (5)$$

The width of the characteristic X-ray generation range $D_{X\varphi}$ is assumed to be equal to the characteristic X-ray generation depth $D_X$, as shown by the following Formula (6).

[Formula 6]

$$D_{X\varphi}=D_X \quad (6)$$

From the characteristic X-ray generation depth $D_X$, the accelerating voltage $E_0$ may be back-calculated based on the following Formula (7), which is another form of Formula (5) described above.

[Formula 7]

$$E_0 = \left[\frac{D_X \cdot \frac{\rho Z}{A}}{0.033} + E_C^{1.7}\right]^{\frac{1}{1.7}} \quad (7)$$

In Formula (7), the width of the characteristic X-ray generation range $D_{X\varphi}$ may be used in place of the characteristic X-ray generation depth $D_X$.

When a definition is employed in which a distance from the specimen surface in a direction perpendicular to the specimen surface is the depth, the above-described depths are calculated in consideration of the specimen inclination. In this case, a correction coefficient ka shown in the following Formula (8) is utilized.

[Formula 8]

$$\kappa a = 1/2(1+\cos T) \quad (8)$$

That is, the electron penetration depth $D_{PE}$ before correction, the back-scattered electron generation depth $D_{BSE}$ before correction, and the characteristic X-ray generation depth $D_X$ before correction are respectively multiplied by the correction coefficient ka, to determine a corrected electron penetration depth $D_{PE}$, a corrected back-scattered electron generation depth $D_{BSE}$, and a corrected characteristic X-ray generation depth $D_X$. Here, the width of the electron penetration range $D_{DE\varphi}$, the width of the back-scattered electron scattering range $D_{BSE\varphi}$, and the width of the characteristic X-ray generation range $D_{X\varphi}$ do not depend on the specimen inclination, and no correction calculation is necessary for these parameters. The correction coefficient ka will be described later.

Figure 4:
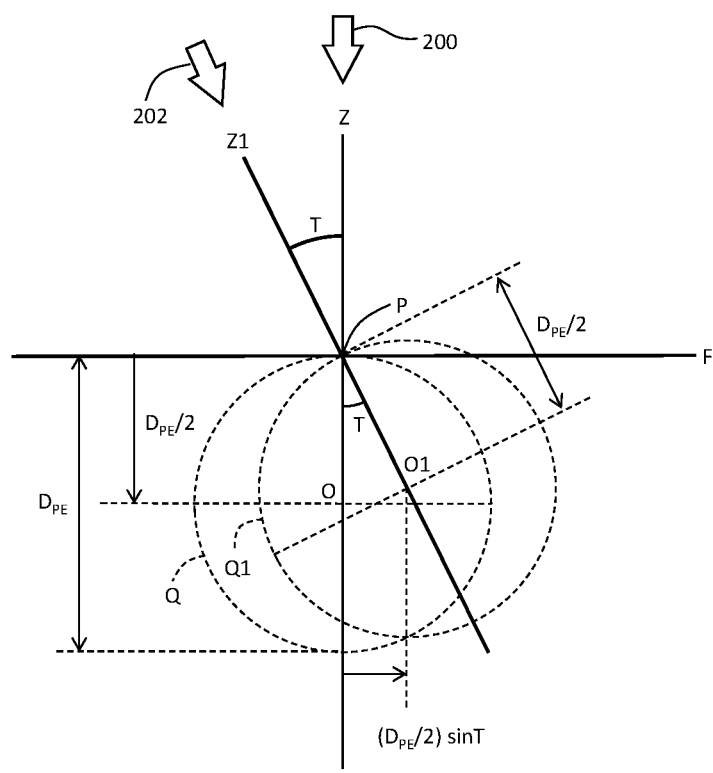
FIG. 4 is a diagram showing a GUI image.

FIG. 4 shows a cross section of the specimen. The specimen surface is shown with F. Z represents an illumination axis in the case of a tilt angle of 0°. Z1 represents the illumination angle in the case of a tilt angle of T°. In reality, the specimen is inclined with respect to the electron beam, but in FIG. 4, the electron beam is shown inclined with respect to the specimen. Here, the electron penetration range is assumed to be a sphere. Although not shown in FIG. 4, the other ranges are also assumed to be spheres.

The electron penetration range in the case of the tilt angle of 0° is shown by a circle Q. The electron penetration depth $D_{PE}$ corresponds to a diameter of the circle Q. A center point O of the circle Q is on the illumination axis Z. A depth of the center point O is $D_{PE}/2$.

When the specimen is inclined (in FIG. 4, when the illumination axis is inclined), the circle Q rotates while maintaining a state in contact with an illumination point P. The electron penetration range at the tilt angle of T° is shown by a circle Q1. A center point O1 of the circle Q1 is on the illumination axis Z1 after the inclination. An amount of movement in the horizontal direction from the center point O to the center point O1 (amount of shift) can be represented as $(D_{PE}/2) \times \sin T$. A correction coefficient kb can be derived from this relationship.

[Formula 9]

$$\kappa b = 1/2 \cdot \sin T \quad (9)$$

The electron penetration depth $D_{PE}$, the back-scattered electron generation depth $D_{BSE}$, and the characteristic X-ray generation depth $D_X$ may respectively be multiplied by the correction coefficient kb, to determine the amount of shift of the center point of the electron penetration range after the inclination, the amount of shift of the center point of the back-scattered electron generation range after the inclination, and the amount of shift of the center point of the characteristic X-ray generation range after the inclination.

In the case of the tilt angle of 0°, these center points are aligned on the illumination axis Z, and coincide with each other on the plan diagram which is in a parallel relationship with the specimen surface F. In the case of the tilt angle of T°, these center points are aligned on the illumination axis Z1, and are dispersed on a predetermined line on the plan diagram which is in the parallel relationship with the specimen surface F. Because a spherical model is employed, even when the specimen is inclined, the width of the electron penetration range $D_{PE\varphi}$, the width of the back-scattered electron generation range $D_{BSE\varphi}$, and the width of the characteristic X-ray generation range $D_{X\varphi}$ are respectively constant.

In FIG. 4, the plan diagram is an image obtained by a projection from an observation direction 200 parallel to the illumination axis Z (first definition). Another definition (second definition) may also be employed in which the plan diagram is an image obtained by a projection from an observation direction 202 parallel to the illumination axis Z1. In this case, even when the specimen is inclined, the shift of the center point does not occur. When the plan diagram included in the GUI image is generated, the first definition is employed. When the plan diagram displayed in the overlapping manner over the specimen image or displayed near the specimen image is generated, the second definition is employed.

When a definition is employed in which a distance from the specimen surface in a direction orthogonal to the specimen surface is the depth, the depth of the center point becomes smaller with the inclination of the specimen. For example, the depth of the center point of the electron penetration range is represented by $(D_{PE}/2) \times \cos T$, in consideration of the inclination. The electron penetration depth in the inclined state is determined by adding $D_{PE}/2$ corresponding to the radius to $(D_{PE}/2) \times \cos T$. The correction coefficient ka shown in Formula (8) is derived based on such an idea.

Figure 5:
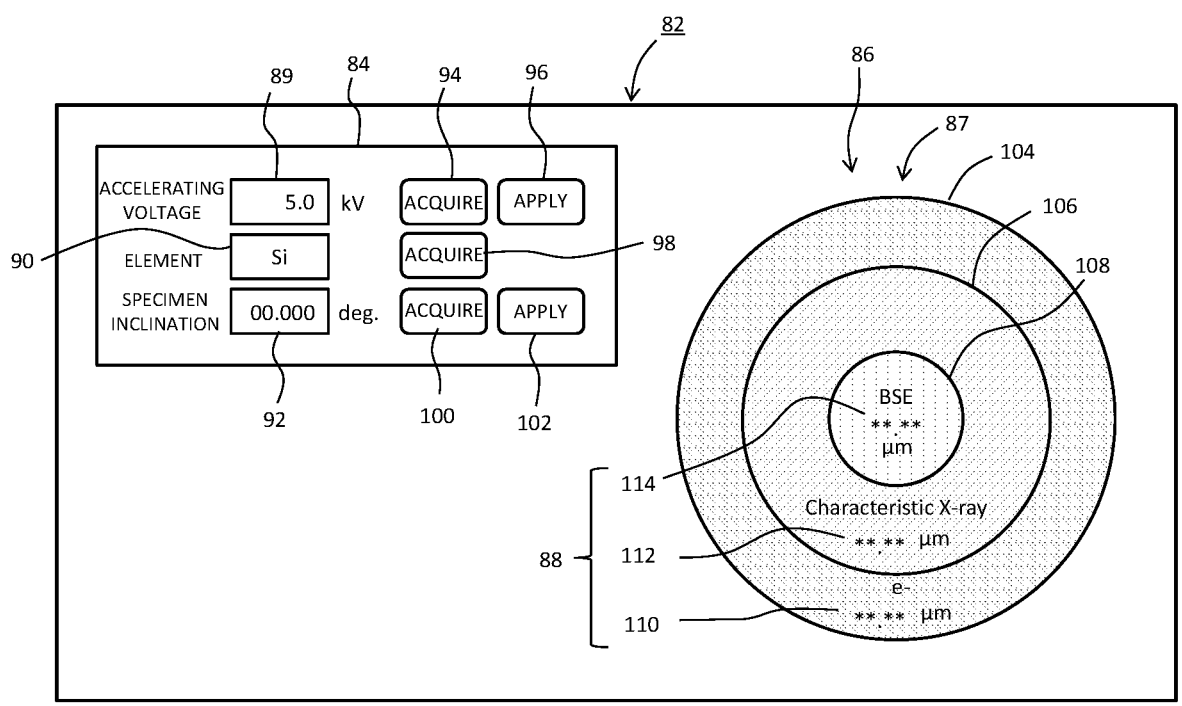
FIG. 5 is a diagram showing a plan diagram in a specimen inclination state.

FIG. 5 shows an example of a GUI image 82. The GUI image 82 includes an input portion 84 and a reference image 86 of a first configuration. The reference image 86 includes a plan diagram 87 and numerical value information 88.

The input portion 84 has a plurality of input fields 89, 90, and 92. More specifically, the accelerating voltage is input using the input field 89. The element forming the specimen is designated using the input field 90. In this process, a periodic table may be displayed and an element may be designated from the table. The tilt angle is designated using the input field 92.

When an acquisition button 94 is operated, the accelerating voltage which is set in the controller is acquired, and is reflected in the input field 89. When an application button 96 is operated, the accelerating voltage displayed in the input field 89 is transferred to the controller, and the accelerating voltage is applied to the controller; that is, the accelerating voltage is activated. When an acquisition button 98 is operated, information for specifying the element forming the specimen is acquired from the analyzer. This information is reflected in the input field 90. Alternatively, a plurality of elements and concentrations of the elements may be acquired from the analyzer. When an acquisition button 100 is operated, the tilt angle which is set in the controller is acquired, and is reflected in the input field 92. When the application button 102 is operated, the tilt angle displayed in the input field is transferred to the controller and is applied to the controller.

The plan diagram 87 is a schematic diagram, and includes a plurality of figures or shapes 104, 106, and 108. Each of the figures or shapes 104, 106, and 108 is specifically a circle. Multiple circles are formed by the plurality of figures or shapes 104, 106, and 108. The illustrated plan diagram 87 is generated assuming the tilt angle of 0°.

Specifically, the figure or shape 104 indicates the electron penetration range in the specimen, the figure or shape 106 indicates the characteristic X-ray generation range in the specimen, and the figure or shape 108 indicates the back-scattered electron generation range in the specimen. Each of the figures or shapes 104, 106, and 108 corresponds to a projected image, or a horizontal cross section. Alternatively, an overlapping rank may be applied to the figures or shapes 104, 106, and 108, and the figures may be colored. In the present embodiment, the figures or shapes 104, 106, and 108 approximately represent the forms of the ranges, and the sizes thereof do not vary even when the sizes of the ranges change. Alternatively, the size of each of the figures or shapes 104, 106, and 108 may be changed according to a change of the size of the respective range.

The numerical value information 88 is formed from a plurality of numerical values 110, 112, and 114. The numerical value 110 indicates the size of the electron penetration range. More specifically, the numerical value 110 indicates the width of the electron penetration range $D_{PE\varphi}$. In place of or along with this value, the electron penetration depth $D_{PE}$ may be displayed. A label near the numerical value 110 shows that the value corresponds to the electron penetration range.

The numerical value 112 indicates the size of the characteristic X-ray generation range. More specifically, the numerical value 112 indicates the width of the characteristic X-ray generation range $D_{X\varphi}$. In place of or along with this value, the characteristic X-ray generation depth $D_X$ may be displayed. A label near the numerical value 112 shows that the value corresponds to the characteristic X-ray generation range. The numerical value 114 indicates the size of the back-scattered electron generation range. More specifically, the numerical value indicates the width of the back-scattered electron generation range $D_{BSE\varphi}$. In place of or along with this value, the back-scattered electron generation depth $D_{BSE}$ may be displayed. A label near the numerical value 114 shows that the value corresponds to the back-scattered electron generation range.

As described, because the reference image 86 includes the plan diagram 87 and the numerical value information 88, through the observation of the reference image 86, it is possible to imagine the electron penetration range, the characteristic X-ray generation range, and the scattered electron generation range in the specimen, and in addition, to quantitatively recognize the sizes of the ranges. Thus, the setting of the illumination condition by the user can be assisted. According to the present embodiment, a reference image may be generated based on an illumination condition which is already set, and an appropriateness of a past illumination condition can be checked at a later time. Further, when an appropriate illumination condition is found through the GUI image, the illumination condition can be set quickly in the controller using the application buttons 96 and 102.

In the reference image 86 of the first configuration, a figure indicating the secondary electron generation range may be added to the plan diagram, and a numerical value indicating a size of the secondary electron generation range may be added to the numerical value information 88. Alternatively, a graph display may be employed in place of the numerical value display. Alternatively, a change of a color phase may be correlated to a change of the size of the range, and the figures indicating the ranges may be painted, with the color phases corresponding to the sizes of the ranges.

Figure 6:
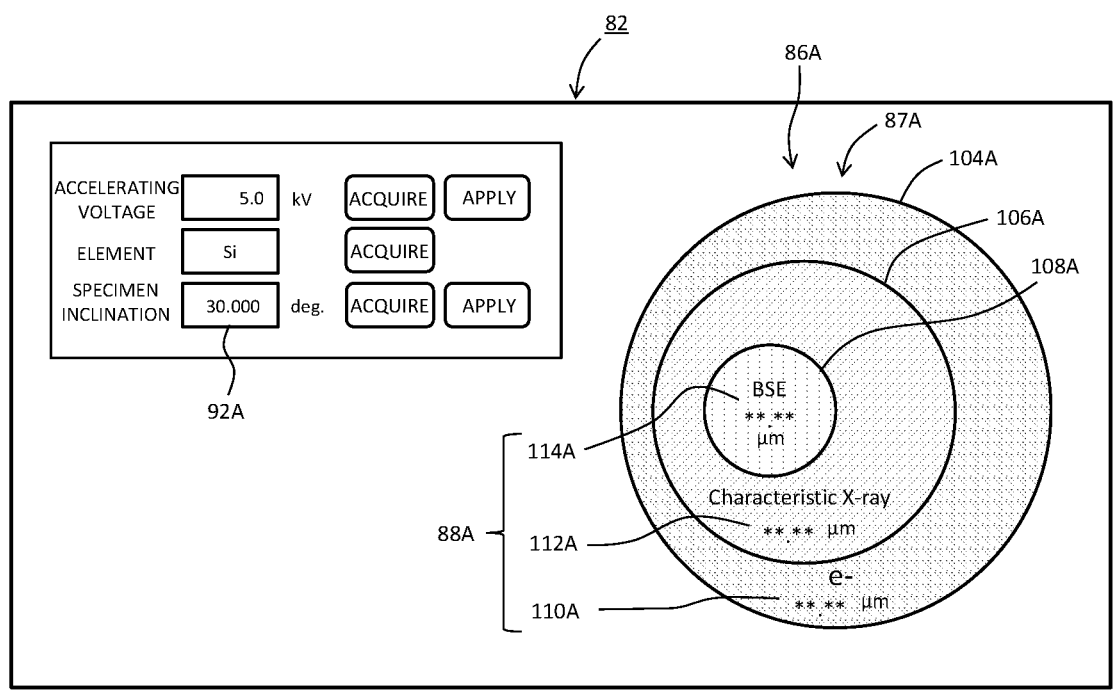
FIG. 6 is a diagram for explaining a center point shift due to a specimen inclination.

FIG. 6 shows a GUI image 82 shown in a specimen inclined state. The tilt angle is designated using an input field 92A. A reference image 86A includes a plan diagram 87A and numerical value information 88A. With the designation of the tilt angle, contents of these change. Center points of a plurality of figures or shapes 104A, 106A, and 108A are relatively shifted in the horizontal direction. As a result, a center of gravity of the multiple circles is deviated. The plan diagram 87A is based on the first definition described above. Numerical values 110A, 112A, and 114A forming the numerical value information 88A are maintained even with the specimen inclination.

Figure 7:
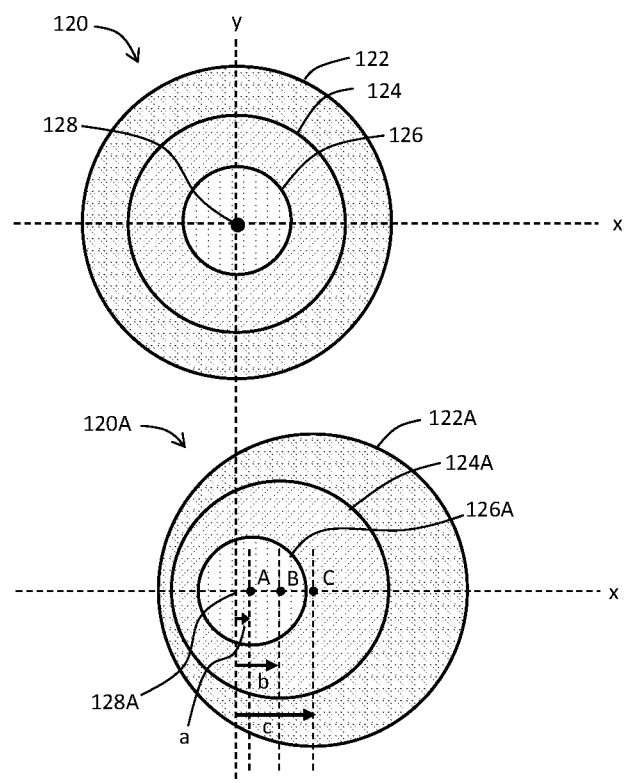
FIG. 7 is a diagram showing a plan diagram before inclination and a plan diagram after the inclination.

FIG. 7 shows a plan diagram 120 before the specimen inclination and a plan diagram 120A after the specimen inclination. In the plan diagram 120, center points of figures or shapes 122, 124, and 126 coincide with an origin 128. In the plan diagram 120A, center points A, B, and C of figures or shapes 122A, 124A, and 126A are shifted from an origin 128A, and are dispersed. On a line x corresponding to the illumination axis, the center points A, B, and C are aligned. With an increase of the tilt angle, amounts of shifts a, b, and c increase.

Figure 8:
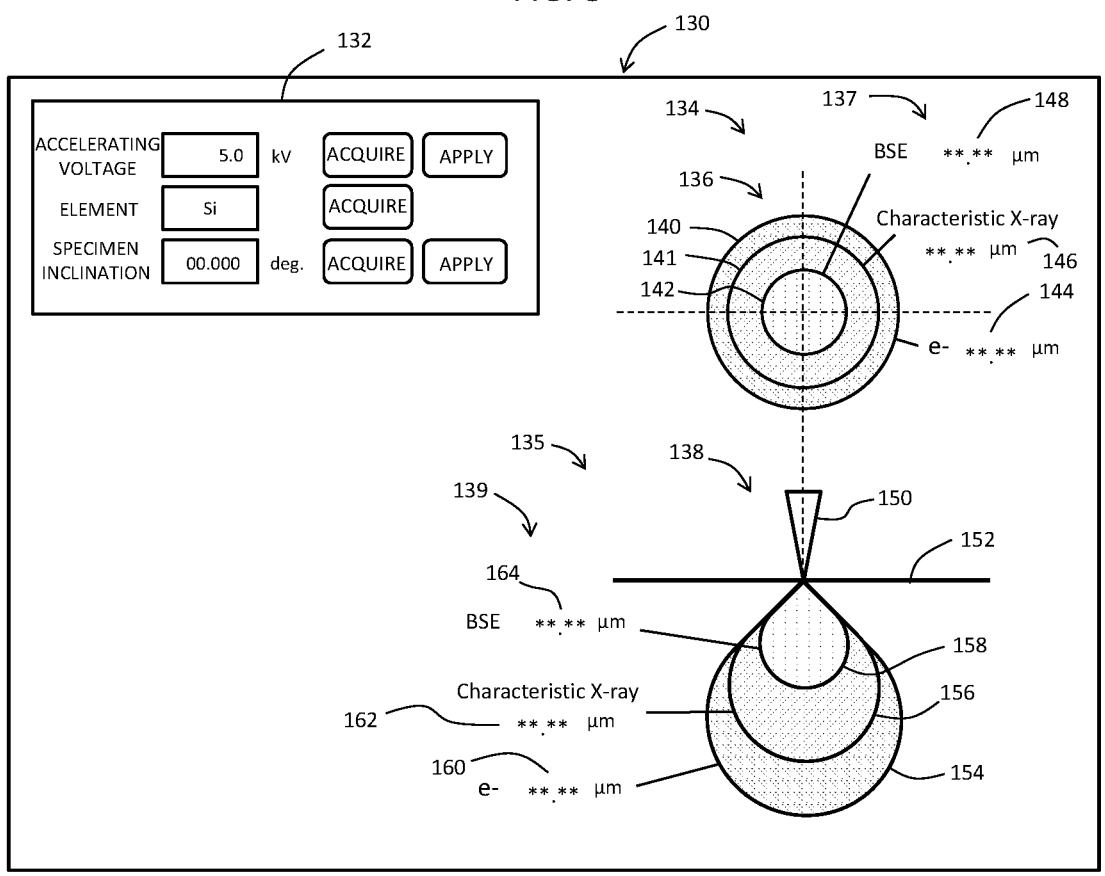
FIG. 8 is a diagram showing another GUI image.

FIG. 8 shows another example of the GUI image. A GUI image 130 includes an input portion 132, a first reference image 134, and a second reference image 135. The first reference image 134 has a plan diagram 136 and numerical value information 137. The second reference image 135 has a cross sectional diagram 138 and numerical value information 139. The plan diagram 136 includes three figures or shapes 140, 141, and 142 indicating three ranges (the electron penetration range, the characteristic X-ray generation range, and the back-scattered electron generation range). The numerical value information 137 includes three numerical value 144, 146, and 148 indicating widths of the three ranges.

The cross sectional diagram 138 includes figures or shapes 154, 156, and 158 indicating three ranges. These figures have a liquid drop shape. Alternatively, the figures or shapes 154, 156, and 158 may be represented with a circle, an ellipse, a vase shape, or the like. A FIG. 152 is a line indicating the specimen surface. A FIG. 150 is a triangle indicating the electron beam. The numerical value information includes three numerical values 160, 162, and 164 indicating sizes of the three ranges in the depth direction.

When the specimen is inclined, the multiple circles in the plan diagram 136 are decentered, the FIG. 152 in the cross sectional diagram 138 is inclined, and portions in the figures or shapes 154, 156, and 158 corresponding to regions at an upper side of the specimen surface are deleted (masked). As the numerical values 160, 162, and 164, numerical values after correction are displayed.

According to the GUI image shown in FIG. 8, it becomes easier to imagine the three-dimensional forms of the ranges, and also, it becomes easier to understand the three-dimensional sizes of the ranges. Therefore, the setting of the illumination condition can be further facilitated.

Figure 9:
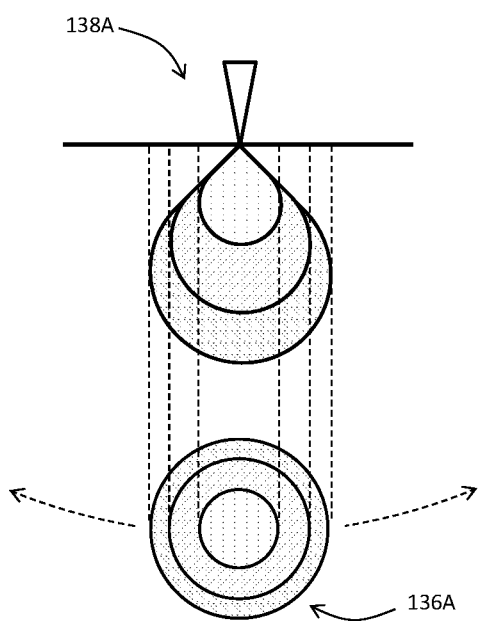
FIG. 9 is a diagram showing an alternative configuration (before inclination)
Figure 10:
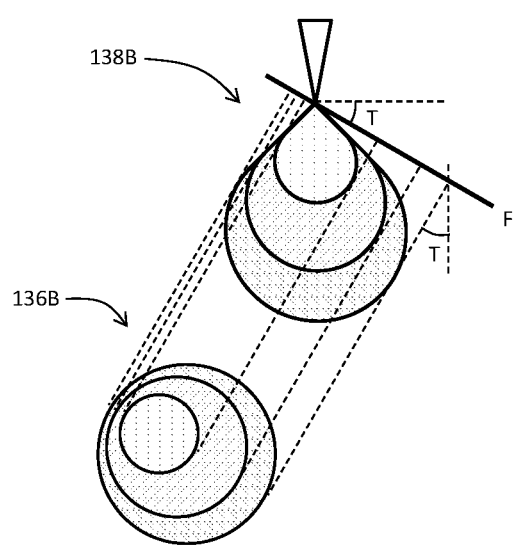
FIG. 10 is a diagram showing an alternative configuration (after inclination)

FIGS. 9 and 10 show an alternative configuration. In FIG. 9, a plan diagram 136A is displayed at a lower side of a cross sectional diagram 138A. As shown in FIG. 10, a plan diagram 136B rotates with respect to a cross sectional diagram 138B according to the tilt angle. In this process, a rotation angle of the plan diagram 136B is determined according to the tilt angle T°. F shows the specimen surface, and figures at an upper side of F are deleted. In the plan diagram 136B, the multiple circles are decentered.

Figure 11:
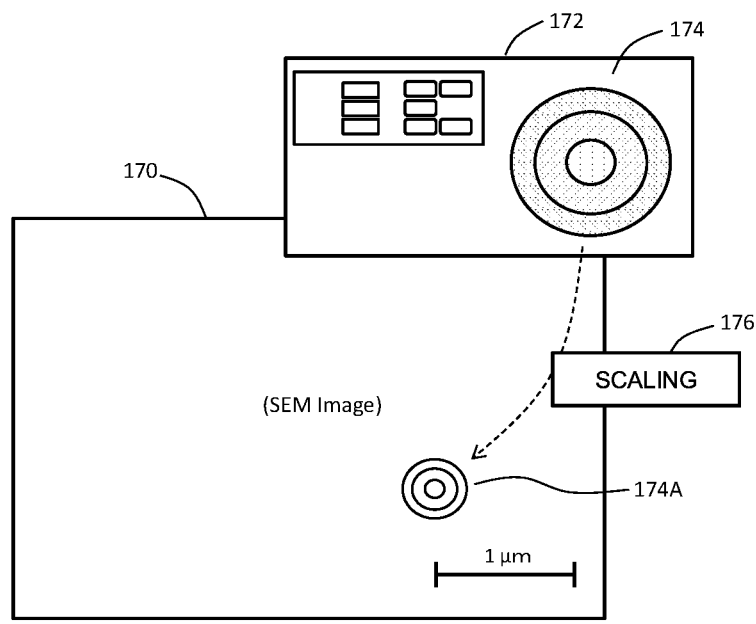
FIG. 11 is a diagram showing transcription of a plan diagram.

As shown in FIG. 11, a plan diagram 174 included in a GUI image 172 may be transcribed (copied) onto a specimen image 170. In this process, a scaling 176 may be performed to match a scale of the plan diagram 174 to a scale of the specimen image 170. When the specimen is inclined, a plan diagram which does not take the inclination of the specimen into consideration is desirably transcribed onto the specimen image 170. That is, as shown in FIG. 4, desirably, an observation direction of the plan diagram is matched with the observation direction 202 of the specimen image. Alternatively, the plan diagram may be displayed over the specimen image from the beginning, without an operation for the transcription. According to the structure of FIG. 11, it becomes possible to recognize, on the specimen image, the size of the electron penetration range, the size of the characteristic X-ray generation range, and the size of the back-scattered electron generation range.

Figure 12:
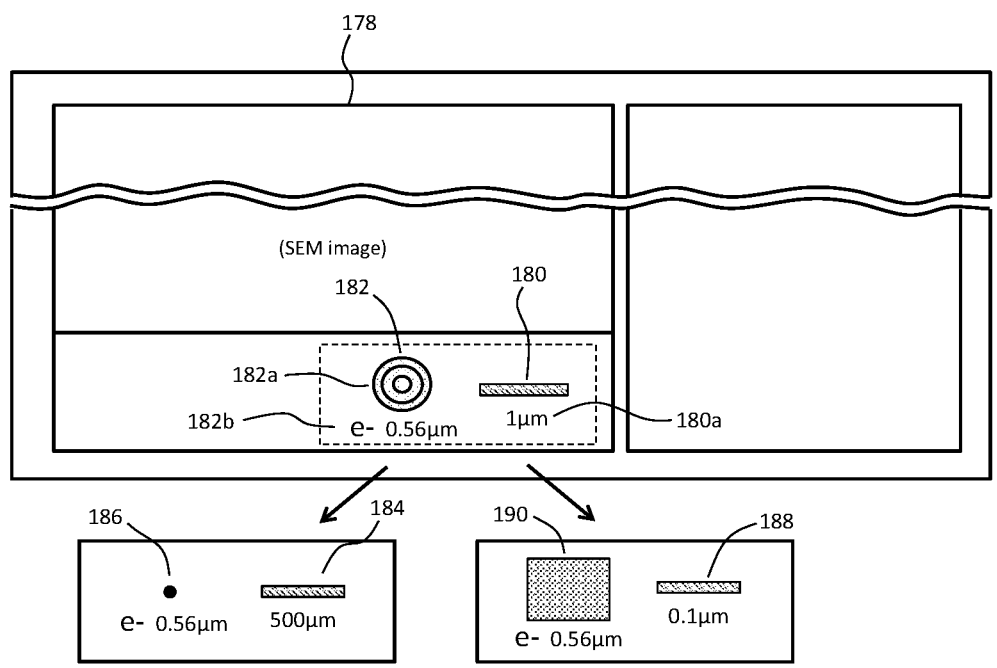
FIG. 12 is a diagram showing a plan diagram displayed along with a scale bar.

As shown in FIG. 12, when a scale bar 180 is displayed adjacent to a specimen image 178, a reference image 182 may be displayed along with the scale bar 180. In this process, the above-described scaling is applied. Scale information 180a is displayed near the scale bar 180. The reference image 182 includes a plan diagram 182a and a numerical value 182b. The numerical value 182b indicates, for example, the width of the electron penetration range.

When a magnification of the specimen image 178 becomes less than or equal to a first threshold, a form of a plan diagram 186 displayed adjacent a scale bar 184 may be set to a simple point or a small circle (that is, a minimum-size figure). When the magnification of the specimen image 178 becomes greater than or equal to a second threshold, a form of a plan diagram 190 displayed adjacent a scale bar 188 may be set to a large quadrangle (a maximum-size figure). In these cases, the fact that the appropriate scaling is not applied may be notified to the user through highlighting or coloring.

The calculation formula and the model described above are merely exemplary, and another calculation formula or another model may be used. In any case, by providing to the user rough estimates roughly showing the ranges of the physical phenomena such as the electron penetration depth, the back-scattered electron generation depth, and the characteristic X-ray generation depth, it becomes possible to improve the convenience of the user or to assist the setting of the illumination condition by the user, in comparison to a case in which none of these pieces of information is provided to the user. In the above-described embodiment, the scanning electron microscope is described, but the above-described structures may alternatively be applied to other charged particle beam apparatuses.

The invention claimed is:

1. A charged particle beam apparatus comprising:
    a calculator configured to calculate a size of a range of a physical phenomenon which occurs in a specimen when a charged particle beam is illuminated onto the specimen, based on specimen information and an illumination condition, wherein the calculator calculates a size of a penetration range of the charged particle beam and a size of a generation range of a signal caused by illumination of the charged particle beam, as the size of the range of the physical phenomenon;
    a generator configured to generate a reference image having a plan diagram indicating the range of the physical phenomenon and numerical value information indicating the size of the range of the physical phenomenon, wherein the plan diagram comprises a first shape indicating the penetration range of the charged particle beam, and a second shape indicating the generation range of the signal; and
    a display configured to display the reference image when an actual illumination condition of the charged particle beam is set.

2. The charged particle beam apparatus according to claim 1, wherein
    the numerical value information comprises a first numerical value indicating a size of the penetration range of the charged particle beam, and a second numerical value indicating a size of the generation range of the signal.

3. The charged particle beam apparatus according to claim 2, wherein
    the plan diagram corresponds to a plane parallel to a surface of the specimen, and
    the generator relatively shifts a center point of each of the figures according to an inclination angle of the specimen with respect to the charged particle beam.

4. The charged particle beam apparatus according to claim 2, wherein
    the plan diagram corresponds to a plane orthogonal to the charged particle beam, and
    a center point of the first figure and a center point of the second figure coincide with each other regardless of an inclination angle of the specimen with respect to the charged particle beam.

5. The charged particle beam apparatus according to claim 1, wherein
    the reference image is a first reference image,
    the generator generates a second reference image having a cross sectional diagram indicating the range of the physical phenomenon, and the first reference image and the second reference image are displayed on the display.

6. The charged particle beam apparatus according to claim 1, further comprising:
a specimen image former configured to form a specimen image based on a sequence of detection signals acquired by scanning the charged particle beam with respect to the specimen; and
a display processor configured to display a plan diagram which is scaled on or near the specimen image.

7. A method of assisting setting, the method comprising:
calculating, with a calculator, a size of a range of a physical phenomenon which occurs in a specimen when a charged particle beam is illuminated onto the specimen, wherein the calculator calculates a size of a penetration range of the charged particle beam and a size of a generation range of a signal caused by illumination of the charged particle beam, as the size of the range of the physical phenomenon;
generating a reference image having a plan diagram indicating the range of the physical phenomenon and numerical value information indicating the size of the range of the physical phenomenon, wherein the plan diagram comprises a first shape indicating the penetration range of the charged particle beam, and a second shape indicating the generation range of the signal; and
displaying the reference image.

* * * * *